(12) United States Patent
Abbott et al.

(10) Patent No.: US 8,471,155 B2
(45) Date of Patent: Jun. 25, 2013

(54) METAL PLUGGED SUBSTRATES WITH NO ADHESIVE BETWEEN METAL AND POLYIMIDE

(75) Inventors: Donald C Abbott, Norton, MA (US); Usman M Chaudhry, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 13/036,579

(22) Filed: Feb. 28, 2011

(65) Prior Publication Data

US 2011/0147934 A1 Jun. 23, 2011

Related U.S. Application Data

(62) Division of application No. 11/811,749, filed on Jun. 12, 2007, now Pat. No. 7,918,018.

(51) Int. Cl.
*H05K 1/16* (2006.01)

(52) U.S. Cl.
USPC .................. 174/260; 174/261; 257/741

(58) Field of Classification Search
USPC ............ 174/260, 262, 261; 257/736, 741
See application file for complete search history.

(56) References Cited

U.S. PATENT DOCUMENTS

| 3,868,724 | A | 2/1975 | Perrino |
| 4,411,982 | A | 10/1983 | Shibuya et al. |
| 5,322,976 | A | 6/1994 | Knudsen et al. |
| 6,418,615 | B1 * | 7/2002 | Rokugawa et al. ............ 29/852 |
| 6,670,718 | B2 | 12/2003 | Chinda et al. |
| 6,916,689 | B2 | 7/2005 | Pritchett et al. |
| 8,237,270 | B2 * | 8/2012 | Kobayashi et al. ........... 257/736 |
| 2007/0175025 | A1 | 8/2007 | Tsukamoto et al. |

FOREIGN PATENT DOCUMENTS

JP 11-121541 4/1994

* cited by examiner

*Primary Examiner* — Timothy Thompson
*Assistant Examiner* — Andargie M Aychillhum
(74) *Attorney, Agent, or Firm* — Steven A. Shaw`; W. James Brady; Frederick J. Telecky, Jr.

(57) ABSTRACT

In a method and apparatus for fabricating a semiconductor device having a flexible tape substrate, a hole is punched in the flexible tape substrate. The flexible tape substrate includes a metal layer attached to a polyimide layer without an adhesive there between. A cover is placed on the metal layer to cap a base of the hole. A metal is deposited on the cover exposed at the base of the hole, the metal being used to form a bond with the metal layer. The metal being deposited causes the hole to be plugged up to a selective height. Upon removal of the cover, the metal may also be deposited on the metal layer to increase a thickness of the metal layer.

7 Claims, 4 Drawing Sheets

METAL PLUGGED SUBSTRATES WITH NO ADHESIVE BETWEEN METAL AND POLYIMIDE

This application is a divisional of application Ser. No. 11/811,749 filed Jun. 12, 2007, the contents of which are herein incorporated by reference in its entirety.

BACKGROUND

The present invention is related in general to the field of semiconductor device assembly and packaging, and more specifically to fabricating integrated circuit (IC) devices having flexible tape substrates.

A flexible tape substrate is typically composed of polymer material such as polyimide, and is often referred to as a polyimide tape substrate or simply as a film substrate. The polyimide tape substrate is typically fabricated by disposing an adhesive material layered between a polyimide layer and a metal layer. As a first step, a surface of a polyimide layer is covered with a film adhesive that is protected by a removable, protective plastic sheet. After punching holes at desired locations, the protective sheet covering the adhesive layer is peeled off, thereby exposing the adhesive surface. A thin copper foil is laminated to the adhesive surface, thereby creating a 3-layer polyimide/adhesive/copper flexible tape substrate having multiple holes in the polyimide layer and no holes in the copper foil.

The adhesive material, which is often soft and sticky, is typically difficult to handle as it tends to stick to the processing equipment such as a punch and die set and also tends to extrude (e.g., stretch during punching). In addition, the adhesive material may be squeezed into a lumen or cavity of the punched hole due to the pressure applied during the lamination of the copper foil. Presence of adhesive material in the lumen of the punched hole may disrupt subsequent metal deposition in the holes, and may potentially lead to the formation of voids at the plug base or formation of defective plug surfaces.

SUMMARY

Applicants recognize an existing need for a method and apparatus for fabricating a semiconductor device using an adhesiveless flexible tape substrate having a metal layer and metal plugged vias, absent the disadvantages found in the prior techniques discussed above. Applicants also recognize that a presence of the adhesive material in the lumen may also result in the formation of a defect such as a notch in a solder ball, the solder ball being coupled to the plugged up hole during the reflow process. The formation of the defect may be a stress initiation point and may result in solder joint cracking during reliability testing.

The foregoing need is addressed by the teachings of the present disclosure, which relates to an apparatus and method for assembly and packaging of semiconductor devices. According to one embodiment, in a method and apparatus for fabricating a semiconductor device having a flexible tape substrate, a hole is punched in the flexible tape substrate. The flexible tape substrate includes a metal layer attached to a polyimide layer without an adhesive there between. A cover is placed on the metal layer to cap a base of the hole. A metal is deposited on the cover exposed at the base of the hole, the metal being used to form a bond with the metal layer. The metal being deposited causes the hole to be plugged up to a selective height. Upon removal of the cover, the metal may also be deposited on the metal layer to increase a thickness of the metal layer.

In one aspect of the disclosure, an apparatus for fabricating a flexible tape substrate of a semiconductor device includes a hole puncher and an electroformer. The hole puncher punches one or more holes in the flexible tape substrate. The flexible tape substrate includes a metal layer attached to a polyimide layer without an adhesive there between. The electroformer is operable to electro deposit a metal, which is also used to form the metal layer. The electroformer includes a mandrel, an electrolyte solution for the metal, and a pair of electrodes powered by an electrical source. A surface of the mandrel is in ohmic contact with the metal layer. The mandrel and the flexible tape substrate are partially immersed in the electrolyte solution. To initiate the electro deposition of the metal, the electrical source provides a negative voltage to the mandrel that is a cathode and a positive voltage to an anode made from the metal. The metal is electro deposited on a surface of the mandrel exposed at the base of the hole. The metal being electro deposited causes the hole to be plugged up to a selective height. Upon removal of the mandrel, the metal is electro deposited on a surface of the metal layer, thereby increasing its thickness.

Several advantages are achieved by the method and apparatus according to the illustrative embodiments presented herein. The embodiments advantageously provide an improved method and apparatus for fabricating a semiconductor device having a flexible tape substrate that is free from the use of adhesives. The adhesiveless fabrication process uses less expensive starting material, eliminates the step of laminating the copper layer on the adhesive surface, and simplifies the punching operation by eliminating the use of adhesives. The adhesiveless fabrication of the flexible tape substrate advantageously eliminates the disruption of metal deposition due to the presence of the adhesive material in the vias, thereby reducing the formation of voids or defective plug surfaces. The adhesiveless fabrication technique advantageously improves semiconductor package reliability by eliminating the possibility of an adhesive in the lumen, thereby eliminating the formation of a defect in the solder. By eliminating the defect, which may potentially become a stress initiation point, stress induced defects such as solder joint cracking during reliability testing are eliminated. The adhesiveless fabrication technique also advantageously uses electroforming for electro deposition of metal on selective areas of the flexible tape substrate. For example, the electroforming is advantageously used to increase a thickness of the metal layer, starting as a seed layer having a thickness less than 2 microns and building it up to a desired thickness measured in tens of microns. Standard substrate fabrication processes such as masking may be deployed to develop trace patterns and etching may be used to selectively remove metal from the metal layer having the increased thickness.

DETAILED DESCRIPTION

Figure 1A:
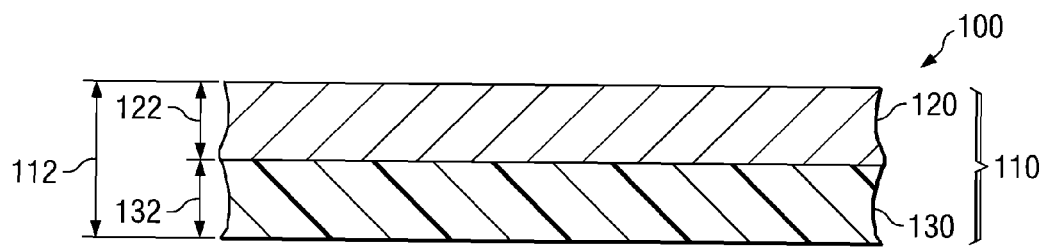
FIG. 1A illustrates a simplified and schematic cross sectional view of a portion of a semiconductor device having a flexible tape substrate that is adhesiveless, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Use of adhesives in the fabrication of flexible tape substrates makes it more challenging to achieve desired product quality and reliability. The adhesive material, which is often soft and sticky, is typically difficult to handle as it tends to stick to the punch and die set and also tends to extrude (e.g., stretch during punching). In addition, the adhesive material may be squeezed into the lumen or cavity of the punched hole due to the pressure applied during the lamination of the copper foil. Presence of adhesive material in the lumen of the punched hole may disrupt the deposition of metal in the holes, and may potentially lead to the formation of voids and defective plug surfaces, thereby reducing product quality and reliability. Presence of the adhesive material in the lumen may also result in a defect such as a notch in the solder ball during the reflow process, which may be a stress initiation point and which may result in solder joint cracking during reliability testing. This problem may be addressed by an apparatus and method for fabricating a semiconductor device having an improved adhesiveless flexible tape substrate. According to an embodiment, in a method and apparatus for fabricating a semiconductor device having a flexible tape substrate, a hole is punched in the flexible tape substrate. The flexible tape substrate includes a metal layer attached to a polyimide layer without an adhesive there between. A cover is placed on the metal layer to cap a base of the hole. A metal is deposited on the cover exposed at the base of the hole, the metal being used to form a bond with the metal layer. The metal being deposited causes the hole to be plugged up to a selective height. Upon removal of the cover, the metal may also be deposited on the metal layer to increase a thickness of the metal layer. A portion of a semiconductor device having an improved adhesiveless flexible tape substrate is described with reference to FIGS. 1A, 1B, 1C, 1D, 1E, 2A, 2B, 2C, 3A and FIG. 3B.

The following terminology may be useful in understanding the present disclosure. It is to be understood that the terminology described herein is for the purpose of description and should not be regarded as limiting.

Semiconductor Package (or Package)—A semiconductor package provides the physical and electrical interface to at least one integrated circuit (IC) or die for connecting the IC to external circuits. The package protects the IC from damage, contamination, and stress that result from factors such as handling, heating, and cooling. The process of putting the IC inside a package to make it reliable and convenient to use is known as semiconductor package assembly, or simply 'assembly'.

Substrate—A substrate is an underlying material used to fabricate a semiconductor device. In addition to providing base support, substrates are also used to provide electrical interconnections between the IC chip and external circuits.

Semiconductor Device—A semiconductor device is an electronic component that utilizes electronic properties of semiconductor materials to perform a desired function. A semiconductor device may be manufactured as a single discrete device or as one or more ICs packaged into a module.

Electroforming—A manufacturing process to form a metal object by electro deposition (may also referred to as electroplating). Electroplating refers to a process to form a metal covered object. Electro deposition is the deposition (e.g., electrochemical reduction) of metal ions from an electrolytic solution in response to an electrical input. The metal is deposited onto a "mandrel" or "former" having a suitable shape to form a metal layer of a desired thickness, followed by the removal of the mandrel to produce a free standing metal or metal covered object. Electroforming is often used to produce precise solid-state electronic devices such as integrated circuit chips. A mandrel is usually a cylindrical metal bar that serves as a core around which material (such as metal) may be cast, molded, forged, bent, deposited, or otherwise shaped.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, a thickness of a metal layer may be configured to be increased from a default value of 1 micron to 40 microns.

Lumen—The inside bore or cavity of a hollow tube, a hole or a via.

FIG. 1A illustrates a simplified and schematic cross sectional view of a portion of a semiconductor device 100 having a flexible tape substrate 110 that is adhesiveless, according to an embodiment. The adhesiveless flexible tape substrates are commonly available for sale and are provided by suppliers such as the 3M Company located in St. Paul, Minn. 55144. In an exemplary, non-depicted embodiment, the semiconductor device 100 may include additional components such as an integrated circuit (IC) or die, electrical interconnects such as bond wires and ball grid arrays, and packaging materials such as a mold compound. Additional details of the semiconductor device 100 after assembly is described with reference to FIG. 1E. In a particular embodiment, the semiconductor device 100 is at least one of a microprocessor, an application specific integrated circuit (ASIC), a digital signal processor, a radio frequency chip, a memory, a microcontroller and a system-on-a-chip or a combination thereof.

In the depicted embodiment, the semiconductor device 100 includes the flexible tape substrate 110 having 2-layers with a combined thickness TS 112. The flexible tape substrate 110 includes a metal layer 120 having a thickness TM 122 that is directly attached to a polyimide layer 130 having a thickness TP 132. That is, the metal layer 120 and the polyimide layer 130 are attached in an adhesiveless manner, e.g., without the presence of an adhesive there between. In a particular embodiment, the metal layer 120 is fabricated using a metal such as copper, silver, gold, nickel, zinc, platinum, palladium, iridium, ruthenium, osmium, rhodium, iron, cobalt, indium, tin, antimony, lead, bismuth, and alloys thereof.

Figure 1B:
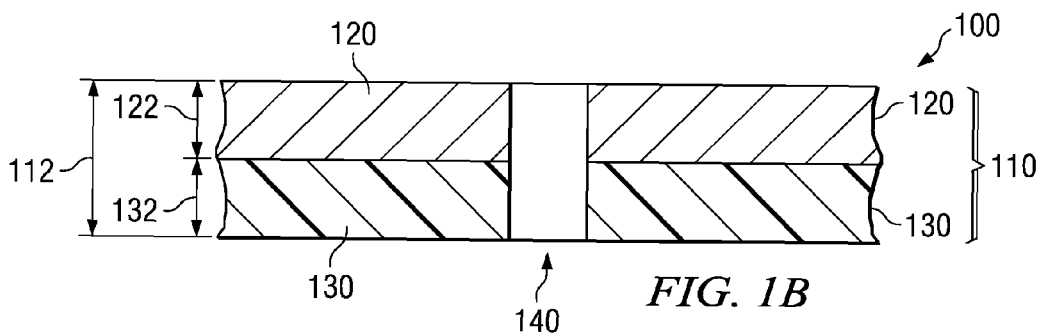
FIG. 1B illustrates a simplified and schematic cross sectional view of a portion of a semiconductor device described with reference to FIG. 1A having a hole punched in a flexible tape substrate, according to an embodiment.

FIG. 1B illustrates a simplified and schematic cross sectional view of a portion of the semiconductor device 100 described with reference to FIG. 1A having a hole 140 punched in the flexible tape substrate 110, according to an embodiment. The hole 140 may be punched through the flexible tape substrate 110 by using a traditional punch and die set. It is understood that although the flexible tape substrate 110 is shown to include one hole, the flexible tape substrate 110 may include a plurality of holes or vias. The lumen of the hole 140 has an exposed edge of the metal layer 120 and an exposed edge of the polyimide layer 130.

Figure 1C:
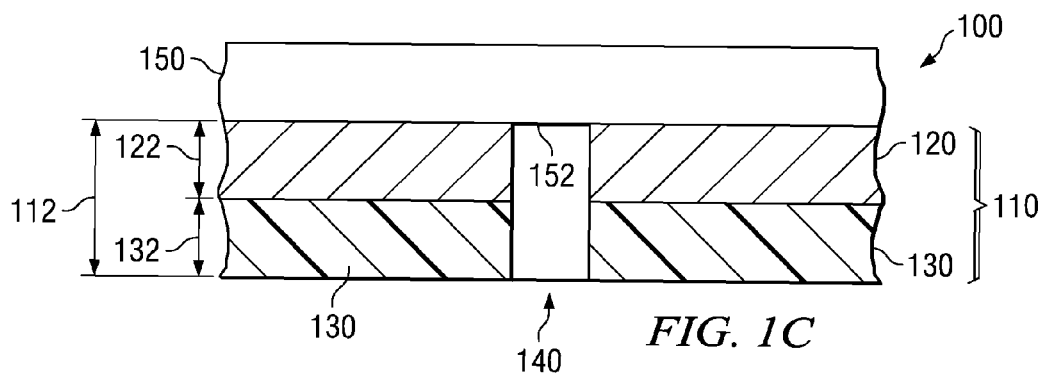
FIG. 1C illustrates a simplified and schematic cross sectional view of a portion of a semiconductor device described with reference to FIG. 1A having a hole that is capped by a cover, according to an embodiment.

FIG. 1C illustrates a simplified and schematic cross sectional view of a portion of the semiconductor device 100 described with reference to FIG. 1A having the hole 140 that is capped by a cover 150, according to an embodiment. In the depicted embodiment, the cover 150 is in direct contact with the metal layer 120. The cover 150 is placed on the metal layer 120 to cap or close a base of the hole 140. It is understood that the dimensions and the shape of the cover 150 may vary with each application, e.g., a cover that is in the shape of a cylinder. In a particular embodiment, the cover 150 is fabricated from a deposit resistant metal that is capable of protecting the top surface of the metal layer 120 from deposition of the metal provided by a metal source (not shown). In a particular embodiment, the cover 150 is fabricated from an electrically conductive material. The electrically conductive material may be a metal selectable from one of stainless steel and nickel, or an alloy thereof. Additional details of an apparatus and a method for the deposition of the metal on selective areas of the flexible tape substrate 110 is described with reference to FIGS. 2A, 2B, and 2C.

Referring back to FIG. 1C, a bottom surface 152 of the cover 150 is coplanar with the top surface of the metal layer 120. The bottom surface 152, which is exposed to the hole 140, is capable of receiving a deposit of the metal from the metal source. The metal being deposited (also referred to as a metal plug) is capable of being bonded to the metal layer 120. In a particular embodiment, the metal being deposited in the hole 140 may be the same as the metal being used to fabricate the metal layer 120, e.g., copper. In another embodiment, the metal being deposited in the hole 140 may be different than the metal being used to fabricate the metal layer 120, e.g., Ni metal deposit on a copper layer. As described earlier, the metal being used for the deposition or the metal layer 120 is selected to be one of copper, silver, gold, nickel, zinc, platinum, palladium, iridium, ruthenium, osmium, rhodium, iron, cobalt, indium, tin, antimony, lead, bismuth, and alloys thereof. The metal being deposited in the hole 140 is capable of plugging the hole 140 up to a selective height. The cover 150, including the bottom surface 152, has a lower coefficient of adhesion to the metal compared to a coefficient of adhesion between the metal and the exposed edge of the metal layer 120 within the hole 140. The difference in the coefficient of adhesion thereby enables the metal plugged in the hole 140 to remain attached to the edge of the metal layer 120 within the hole 140 when the cover 150 is separated from the metal layer 120. The cover 150 may be treated to further reduce the coefficient of adhesion to the metal.

Figure 1D:
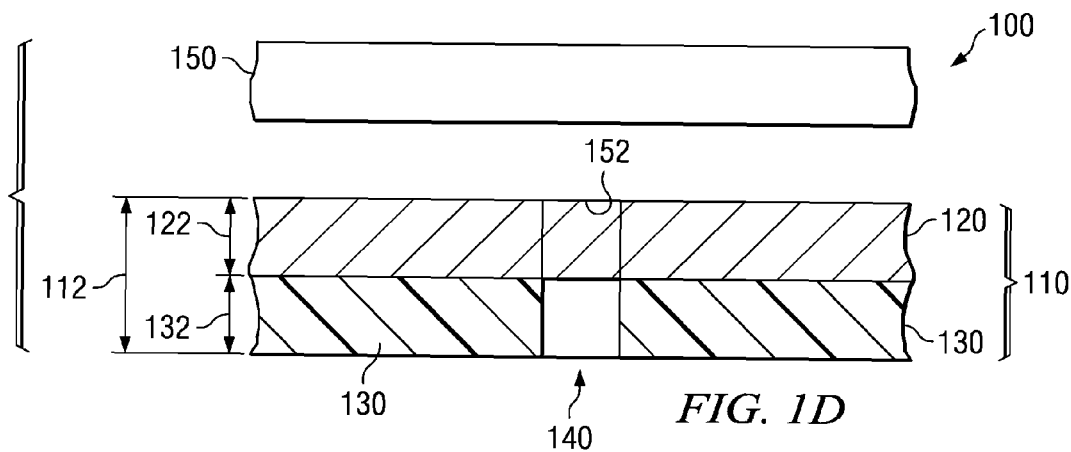
FIG. 1D illustrates a simplified and schematic cross sectional view of a portion of a semiconductor device described with reference to FIG. 1A having a hole that is plugged with a metal up to a selective height, according to an embodiment.

FIG. 1D illustrates a simplified and schematic cross sectional view of a portion of the semiconductor device 100 described with reference to FIG. 1A having the hole 140 plugged with the metal up to a selective height, according to an embodiment. In the depicted embodiment, the cover 150 is separated (e.g., lifted or physically removed) from the metal layer 120. The base of the hole 140, which is plugged with the metal, is coplanar with the metal layer 120. An amount of metal deposited in the hole 140 may be varied to adjust the selective height from 0 to a fully plugged hole. The selective height of the fully plugged hole 140 is equal to the thickness TS 112. In the depicted embodiment, the selective height is equal to the thickness TS 122, which is equal to the thickness of the metal layer 120.

In an exemplary, non-depicted embodiment, the flexible tape substrate 110 may undergo further processing to complete the assembly and packaging of the semiconductor device 100. For example, a thickness of the metal layer 120, or the selective height of the metal deposit in the hole 140, or both may be adjusted, e.g., increased or decreased, by additional deposition or removal of the metal. A mask may be used to form a circuit pattern on the metal layer. Unwanted metal may be stripped or etched away to leave the desired circuit pattern.

Figure 1E:
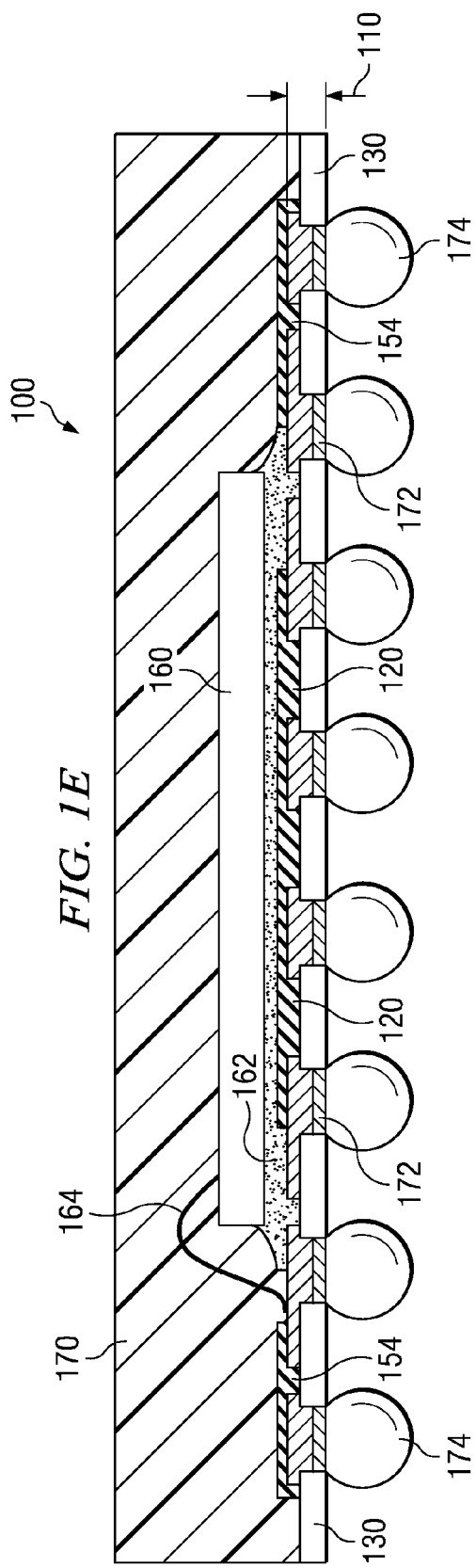
FIG. 1E illustrates a simplified and schematic cross sectional view of a semiconductor device described with reference to FIG. 1A after assembly, according to an embodiment.

FIG. 1E illustrates a simplified and schematic cross sectional view of a semiconductor device 100 described with reference to FIGS. 1A, 1B, 1C, and 1D after assembly, according to an embodiment. In the depicted embodiment, the semiconductor device 100 is assembled using the flexible tape substrate 110, the metal layer 120 having the desired metal patterns, a die attach compound 162, a die 160, a bond wire 164, and a mold compound 170. A solder resist 154 material is applied on the top surface of the polymide layer 130 and the metal layer 120 to protect areas where solder may not be desired. The die 160 is attached to the flexible substrate 110 using the die attach compound 162. As described earlier, the metal that is deposited in the hole forms a metal plug 172 having a selective height varying from 0% to 100%, e.g., a fully plugged hole or via. It may be desirable to select the height of the metal plug 172 in the via to be at least around 30%. This advantageously drives out solder voids from the via and also restricts the moisture, which may be present in the flexible tape substrate 110, from entering the solder in the vias. The metal plug 172 electrically couples the metal layer 120 to a corresponding solder ball 174 of a plurality of solder balls arranged in a ball grid array. A portion of the solder ball 174 extends into the vias and attaches to the metal plug 172.

The die 160 is electrically coupled to the metal layer 120, and hence to the metal plug 172 and the solder ball 174, using the bond wire 164. The semiconductor package is then encapsulated using the mold compound 170.

Figure 2A:
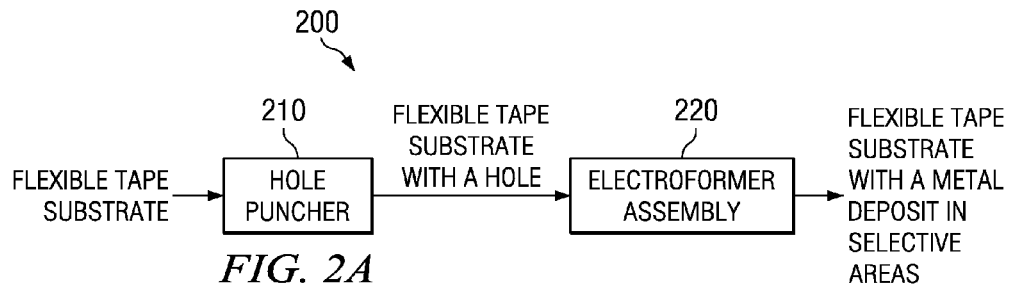
FIG. 2A illustrates a simplified block diagram of an apparatus for fabricating a portion of a semiconductor device described with reference to FIGS. 1A, 1B, 1C and 1D, according to an embodiment.

FIG. 2A illustrates a simplified block diagram of an apparatus 200 for fabricating a portion of the semiconductor device 100 described with reference to FIG. 1A, according to an embodiment. In the depicted embodiment, the apparatus 200 includes a hole puncher 210 and an electroformer assembly 220. In an embodiment, the hole puncher 210 is operable to punch a through hole 140 in the flexible tape substrate 110, thereby producing the flexible tape substrate 110 having the hole 140. The electroformer assembly 220 is operable to electro deposit metal on selective areas of the flexible tape substrate 110 having the hole 140. As described earlier, electroforming is a manufacturing process to form a metal object by electro deposition (also referred to as electroplating). Electro deposition is the deposition (e.g., electrochemical reduction) of metal ions from an electrolytic solution in response to an electrical input. In the depicted embodiment, the electroformer assembly 220 is operable to electro deposit a metal, the metal being the same metal that is used to form the metal layer 120. Additional details of the electroformer assembly 220 is described with reference to FIG. 2B.

Figure 2B:
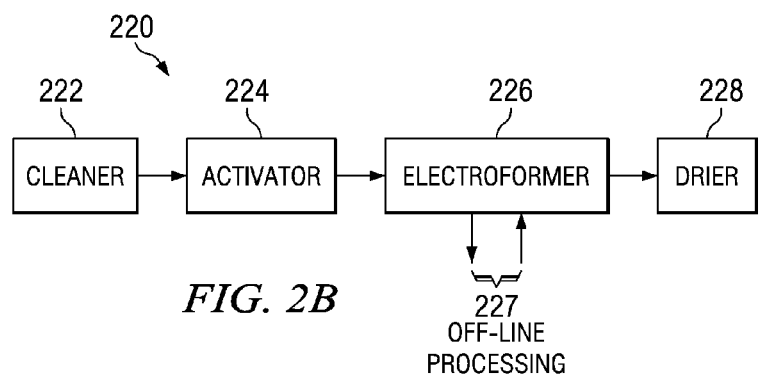
FIG. 2B illustrates a simplified block diagram of an electroformer assembly described with reference to FIG. 2A, according to an embodiment.

FIG. 2B illustrates a simplified block diagram of the electroformer assembly 220 described with reference to FIG. 2A, according to an embodiment. In the depicted embodiment, the electroformer assembly 220 includes a cleaner 222, an activator 224, an electroformer 226, and a drier 228. In an exemplary, non-depicted embodiment, a rinser may be added to perform a rinse operation prior to each stage or after each stage or a combination thereof. The flexible tape substrate 110 having the hole 140 is cleaned by the cleaner 222 to remove undesirable deposits or debris during the punching process. The cleaner 222 may include an alkaline electrocleaning solution. Strength of the cleaner 222 is adjustable to facilitate cleaning but avoiding etching or dissolution of the metal layer 120.

The activator 224 is operable to activate the metal surface of the metal layer 120, thereby facilitating a uniform electro deposition of the metal. The activator 224 may include chemicals, e.g., acids, that reduce oxides formed on the surface to activate the metal surface. The electroformer 226 is operable to perform the electro depositing of the metal on selective areas of the cleaned and activated metal surfaces of the flexible tape substrate 110 having the hole 140. Certain operations of the electroformer 226 such as plating on both sides of a substrate may be performed by removal of components or may be performed off-line. Additional details of the electroformer 226 are described with reference to FIG. 2C. The drier 228 is operable to dry the surfaces of the flexible tape substrate 110 that have received the electro deposit treatment.

Figure 2C:
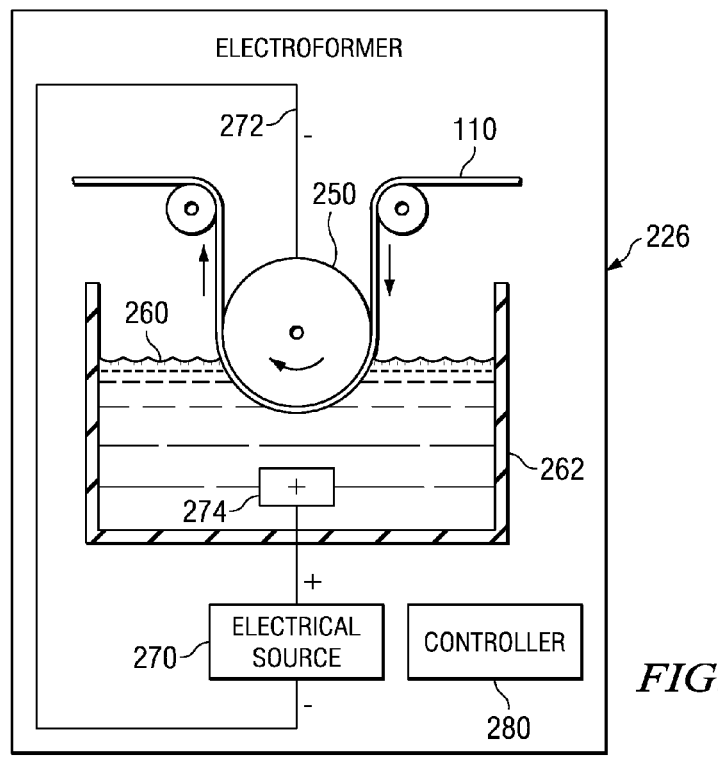
FIG. 2C illustrates a simplified block diagram of an electroformer described with reference to FIG. 2B, according to an embodiment.

FIG. 2C illustrates a simplified block diagram of the electroformer 226 described with reference to FIG. 2B, according to an embodiment. In the depicted embodiment, the electroformer 226 includes a mandrel 250, an electrolyte solution 260 for the metal, a tank 262 containing the electrolyte solution 260, an electrical source 270, and a controller 280. The electrical source 270, which may be a rectifier, is operable to provide power to perform the electroforming. The electrical source 270 includes a negative voltage provided to the mandrel 250, which is connected as a cathode 272. The electrical source 270 includes a positive voltage connected to an anode 274 that is formed from the metal. The electrolyte solution 260 supports the electro depositing process by facilitating electrode dissolution and replenishment of the metal ions in the tank 262.

In an embodiment, the mandrel 250 is the same as the cover 150 described with reference to FIG. 1C and the anode 274 is the metal source. Referring back to FIG. 2C, the surface of the mandrel 250, which is coupled to the cathode 272, is in ohmic contact with the metal surface 120 portion of the flexible tape substrate 110 having the hole 140. Thus, the metal surface 120 is electrically coupled to the cathode 272. The mandrel 250 and the flexible tape substrate 110 are partially immersed in the electrolyte solution 260. The mandrel 250 is capable of being rotated around an axis to control an amount of time the hole 140 is completely immersed in the electrolyte solution 260. By being in ohmic contact, the metal surface 120, except for the base of the hole 140, is advantageously shielded by the surface of the mandrel 250 from receiving the electro deposit of the metal.

The controller 280 is operable to receive inputs and control an amount of metal that is electro deposited on selective areas of the flexible tape substrate 110 such as in the hole 140 by controlling the amount of time the hole 140 is immersed in the electrolyte solution 260 and by controlling an amount of current flowing between the cathode 272 and the anode 274. The controller 280 may be operated in manual control, e.g., by an operator, or may be operated in automatic control. For example, the controller 280 is operable to adjust the time and the current to cause the electro depositing of the metal on the surface of the mandrel 250 exposed to the hole 140, thereby causing the hole 140 to be plugged with the metal up to the selective height, e.g., a height that is equal to the thickness TS 122 of the metal layer 120.

In an embodiment, after reaching the selective height of the plug in the hole 140, the mandrel 250 may be removed from the tank, e.g., to perform off-line processing 227. Examples of the off-line processing 227 may include substrate masking, developing, and etching. The masking, developing, and etching operations form the pattern side assuming the metal layer 120 laminated to the flexible substrate 110 is of a desired thickness. In some applications, the off-line processing may include a final plating process, to cover selective surfaces of the patterns and plugs with metal layers such as Ni and Au. In some applications, the off-line processing may include increasing a thickness of the metal layer 120 using an electroplating process. In this application, the metal layer 120 is in the form of a thin seed layer. The thickness of the thin seed layer is built up having patterns of metal that may be over plated with metals such as Ni and Au or Ni and Pd, after which the resist is stripped and the seed layer is etched away leaving electrically discrete patterns capped with thin layers of other metals. In some applications, the metal layer 120 may have the desired thickness. After masking, exposing-developing trace side, and plating, e.g., with Ni+Au, and stripping resist, the metal layer 120 exposed with no Ni and Au is etched to the polyimide using Ni+Au as etch mask, thus forming electrically discrete traces or patterns.

The removal of the mandrel 250 causes the metal deposited on the mandrel 250 to remain with the metal layer 120. The separation of the mandrel 250 exposes a continuous top surface of the metal layer 120. The base of the hole 140 has a plugged-in surface that is coplanar with the metal layer 120. The separation also enables electro deposition of the metal on additional areas of the flexible tape substrate 110 having the hole 140 that is at least partially plugged up. That is, the flexible metal tape 110 having at least a partially plugged up hole may be immersed in the electrolyte solution 260 for receiving additional electro deposit treatment, if desired. For example, a thickness of the metal layer 120 may be increased from TS 122 to a thickness TS2 292. In a particular embodiment, the metal layer 120 is a seed layer having a first thickness of less than 2 microns. The thickness of the metal layer may be increased to approximately 50 microns through the electro deposition process. Similarly, the electro deposition of the metal in the lumen of the hole 140 may be increased from an height that equal to TS 122 to a second height TH2 294 that is less than the thickness TS 112. If an initial thickness of the metal layer 120 meets desired needs then no further electro deposition treatment may be provided. As described earlier, in an exemplary, non-depicted embodiment, a mask may be used to form a circuit pattern on the metal layer 120. Unwanted metal may be stripped or etched away to leave the desired circuit pattern. If a seed layer is used, then after patterning and plating to desired thickness, the etching process is used to remove the seed layer.

Figure 3A:
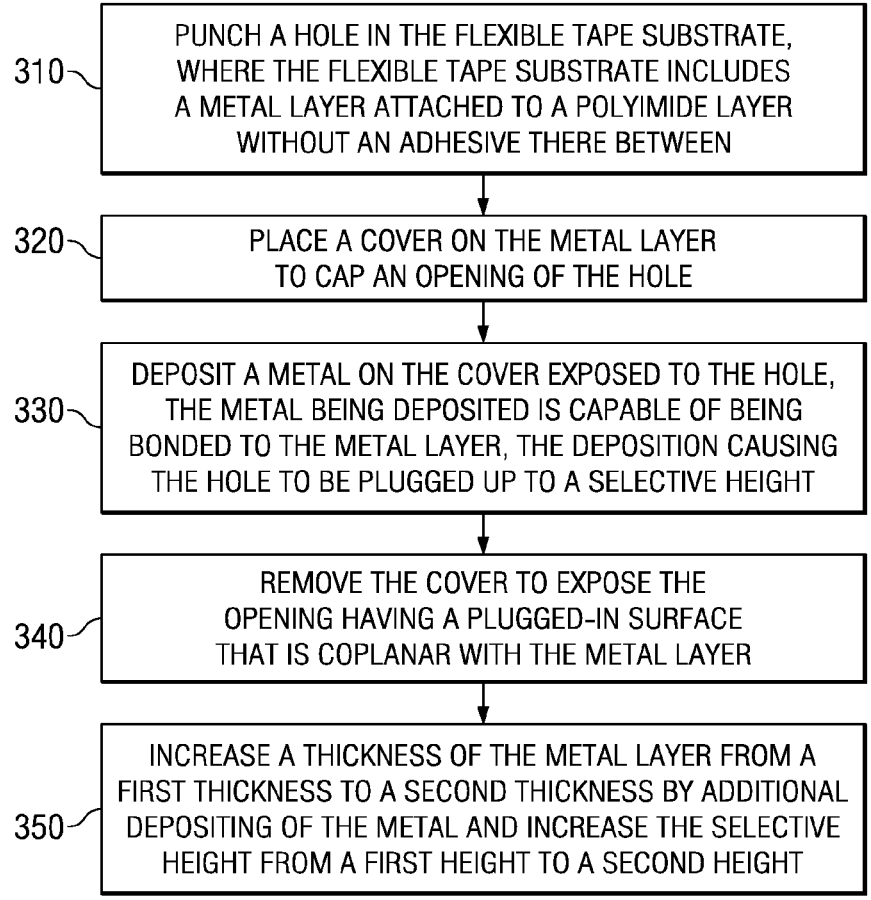
FIG. 3A is a flow chart illustrating a method for fabricating a semiconductor device having a flexible substrate, according to an embodiment.

FIG. 3A is a flow chart illustrating a method for fabricating a semiconductor device having a flexible substrate, according to an embodiment. In a particular embodiment, FIG. 3A illustrates the process for fabricating the semiconductor device 100 described with reference to FIGS. 1A, 1B, 1C, 1D, 1E, 2A, 2B and FIG. 2C. At step 310, a hole is punched in the flexible tape substrate. The flexible tape substrate includes a metal layer attached to a polyimide layer without an adhesive there between. At step 320, a cover is placed on the metal layer to cap a base of the hole. At step 330, a metal is deposited on the cover exposed at the base of the hole. The metal being deposited, which may be the same metal used to form the metal layer, causes the hole to be plugged up to a selective height. At step 340, the cover is removed to expose the base having a plugged-in surface that is coplanar with the metal layer. At step 350, a thickness of the metal layer is increased from a first thickness to a second thickness by additional depositing of the metal and the selective height is increased from a first height to a second height in response to the metal being deposited in the lumen of the hole.

Figure 3B:
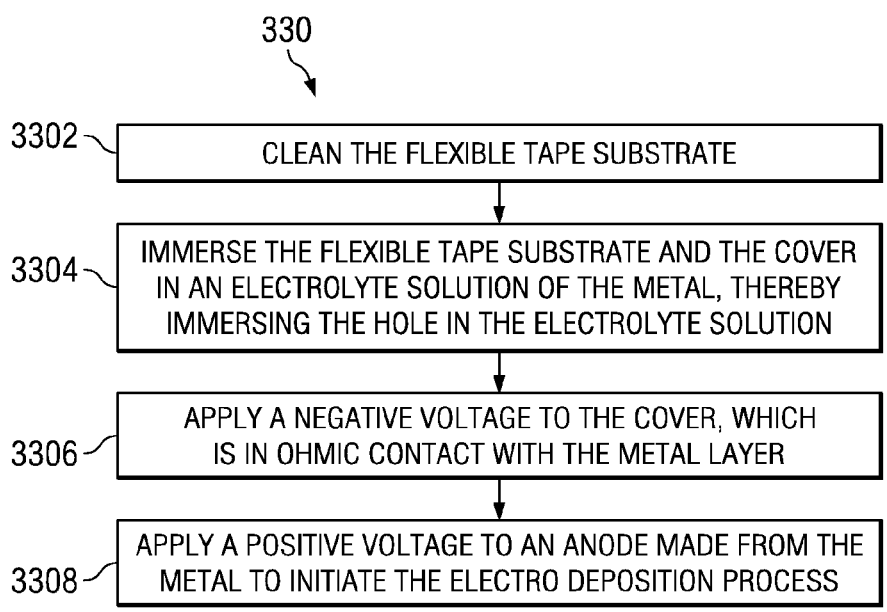
FIG. 3B is a flow chart illustrating a method for depositing a metal by electroforming described with reference to FIG. 3A, according to an embodiment.

Various steps described above may be added, omitted, combined, altered, or performed in different orders. For example, step 330 may be divided into sub steps. FIG. 3B is a flow chart illustrating a method for depositing a metal by electroforming, according to an embodiment. In a particular embodiment, FIG. 3B illustrates the process for electroforming described with reference to FIGS. 2A, 2B and FIG. 2C. At step 3302, the flexible tape substrate is cleaned. At step 3304, the flexible tape substrate and the cover is immersed in an electrolyte solution of the metal, thereby immersing the hole in the electrolyte solution. At step 3306, a negative voltage is applied to the cover, which is in ohmic contact with the metal layer. At step 3308, a positive voltage is applied to an anode made from the metal to initiate the electro deposition process.

Several advantages are achieved by the method and apparatus according to the illustrative embodiments presented herein. The embodiments advantageously provide an improved method and apparatus for fabricating a semiconductor device having a flexible tape substrate that is free from the use of adhesives, e.g., is without an adhesive or is adhesiveless. The adhesiveless fabrication process advantageously uses less expensive starting material, eliminates the step of laminating the copper layer on the adhesive surface, and simplifies the punching operation by eliminating the use of adhesives. The adhesiveless fabrication of the flexible tape substrate also advantageously eliminates the disruption of metal deposition due to the presence of the adhesive material in the vias, thereby reducing the formation of voids or defective plug surfaces. The adhesiveless fabrication technique advantageously improves semiconductor package reliability by eliminating the possibility of an adhesive in the lumen, thereby eliminating the formation of a defect such as a notch in the solder. By eliminating the defect, which may potentially become a stress initiation point, stress induced defects such as solder joint cracking during reliability testing are eliminated. The adhesiveless fabrication technique also uses electroforming for electro deposition of metal on selective areas of the flexible tape substrate. For example, the electroforming is advantageously used to increase a thickness of the metal layer, starting as a seed layer having a thickness less than 2 microns and building it up to a desired thickness measured in tens of microns. Standard processes such as masking may be deployed to develop trace patterns and etching may be used to remove metal from the metal layer having the increased thickness.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of using copper as a metal for electroforming, those of ordinary skill in the art will appreciate that the processes disclosed are capable of being used for assembly of semiconductor devices having different types of metals and different metal deposition techniques.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A semiconductor device, comprising
   a two-layered flexible tape substrate comprising a polymer layer on a first side and a metal layer on a second side opposite the first side and no intervening adhesive layer between the polymer layer and the metal layer;
   holes through the polymer layer and the metal layer of the two-layered flexible tape substrate;
   plugs of plated non-solder metal each partially filling one of the holes and each having a top surface co-planar with a top surface of the metal layer surface not in contact with the polymer layer; and
   a semiconductor die affixed to the top surface of the metal layer and the plugs.

2. The semiconductor device of claim 1, in which the polymer layer is a polyimide layer.

3. The semiconductor device of claim 1, in which the metal layer includes copper.

4. The semiconductor device of claim 1, in which the non-solder metal includes copper.

5. The semiconductor device of claim 4, further comprising solder balls each attached to a copper plug inside a hole.

6. The semiconductor device of claim 1, in which the semiconductor die is wire-bonded to the substrate.

7. The semiconductor device of claim 1, further comprising distinct boundary between each plug and wall of corresponding hole through the metal layer.

* * * * *